United States Patent
Kim et al.

(10) Patent No.: US 7,825,683 B2
(45) Date of Patent: Nov. 2, 2010

(54) ON DIE TERMINATION DEVICE AND SEMICONDUCTOR MEMORY DEVICE INCLUDING THE SAME

(75) Inventors: Ki-Ho Kim, Kyoungki-do (KR); Ji-Eun Jang, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 61 days.

(21) Appl. No.: 12/181,628

(22) Filed: Jul. 29, 2008

(65) Prior Publication Data
US 2009/0115449 A1  May 7, 2009

(30) Foreign Application Priority Data
Nov. 2, 2007   (KR)   ............. 10-2007-0111349

(51) Int. Cl.
*H03K 17/16* (2006.01)
(52) U.S. Cl. .................. 326/30; 326/21; 327/108
(58) Field of Classification Search ............. 326/30, 326/21, 86; 327/108
See application file for complete search history.

(56) References Cited

U.S. PATENT DOCUMENTS

| | | | |
|---|---|---|---|
| 7,420,387 B2* | 9/2008 | Lee et al. | 326/30 |
| 7,528,626 B2* | 5/2009 | Kim | 326/30 |
| 2008/0054936 A1* | 3/2008 | Fujisawa | 326/30 |
| 2008/0054937 A1* | 3/2008 | Kinoshita et al. | 326/30 |
| 2008/0054981 A1* | 3/2008 | Hosoe et al. | 327/333 |
| 2008/0157811 A1* | 7/2008 | Lee et al. | 326/30 |
| 2009/0009213 A1* | 1/2009 | Osanai et al. | 326/30 |

FOREIGN PATENT DOCUMENTS

| KR | 1020040021110 | 3/2004 |
|---|---|---|
| KR | 1020040083814 | 10/2004 |

* cited by examiner

*Primary Examiner*—Vibol Tan
(74) *Attorney, Agent, or Firm*—IP & T Group LLP

(57) ABSTRACT

On die termination (ODT) device that can reduce the number of lines for transferring calibration codes to reduce the size of a chip including the ODT device. The ODT device includes a calibration circuit configured to generate calibration codes for determining a termination resistance, a counting circuit configured to generate counting codes increasing with time. A transferring circuit of the device is configured sequentially to transfer the calibration codes in response to the counting codes. A receiving circuit is configured sequentially to receive the calibration codes from the transferring circuit in response to the counting codes. A termination resistance circuit of the device is configured to perform impedance matching using a resistance determined according to the calibration codes.

20 Claims, 7 Drawing Sheets

ON DIE TERMINATION DEVICE AND SEMICONDUCTOR MEMORY DEVICE INCLUDING THE SAME

CROSS-REFERENCE TO RELATED APPLICATIONS

The present invention claims priority of Korean patent application number 10-2007-0111349, filed on Nov. 2, 2007, which is incorporated by reference in its entirety.

BACKGROUND OF THE INVENTION

The present invention relates to an on die termination (ODT) device and a semiconductor memory device including the same, and more particularly, to an on die termination device of a decreased size and a semiconductor memory device including the same.

Semiconductor devices are implemented into integrated circuit (IC) chips such as central processing units (CPUs), memories, and gate arrays, and are incorporated into a variety of electrical products such as personal computers, servers, and workstations. Most of semiconductor devices include an input circuit configured to receive signals from an outside world via input pads and an output circuit configured to provide internal signals to an outside world via output pads.

As the operating speed of electrical products is increasing, a swing width of a signal exchanged between semiconductor devices is being gradually reduced for minimizing a delay time taken for signal transmission. However, the reduction in the swing width of the signal has a great influence on an external noise, causing the signal reflectivity to be more critical at an interface terminal due to impedance mismatch. Such impedance mismatch is generally caused by an external noise, a variation of a power supply voltage, a change in an operating temperature, a change in a manufacturing process, etc. The impedance mismatch may lead to a difficulty in high-speed data transmission and distortion of output data. Therefore, if semiconductor devices receive the distorted output signal through an input terminal, problems such as a setup/hold failure and an error in decision of an input level may be frequently arisen.

In particular, in order to resolve the above problems, a memory device requiring high-speed performance employs an impedance matching circuit, which is called an ODT device, near an input pad inside an IC chip. In a typical ODT scheme, source termination is performed at a transmitting end by an output circuit, and parallel termination is performed at a receiving end by a termination circuit connected in parallel to a receiving circuit coupled to the input pad.

ZQ calibration refers to a procedure of generating pull-up and pull-down codes which are varied with process, voltage and temperature (PVT) conditions. The resistance of the ODT device, e.g., a termination resistance at a DQ pad in a memory device, is calibrated using the codes resulting from the ZQ calibration. The ZQ calibration is named because the calibration is performed using a ZQ node that is a node for calibration.

The ZQ calibration in the ODT device will be described below.

FIG. 1 is a circuit diagram of a conventional calibration circuit performing a ZQ calibration in an ODT device.

Referring to FIG. 1, the conventional ODT device includes a first calibration resistance unit 110, second calibration resistance units 120 and 130, a reference voltage generation unit 102, comparing units 103 and 104, and counting units 105 and 106 to perform the ZQ calibration. The ZQ calibration is enabled by an operation control unit 107 and a counting unit 108.

The first calibration resistance unit 110 includes a plurality of pull-up resistors which are turned on/off in response to pull-up calibration codes PCODE<0:N>. The second calibration resistance units 120 and 130 include a pull-up calibration resistance unit 120 and a pull-down calibration resistance unit 130. The pull-up calibration resistance unit 120 has the same configuration as the first calibration resistance unit 110. The pull-down calibration resistance unit 130 includes a plurality of pull-down resistors which are turned on/off in response to pull-down calibration codes NCODE<0:N>.

The first calibration resistance unit 110 is calibrated with an external resistor 101 connected to a ZQ node to generate primary calibration codes, pull-up calibration codes PCODE<0:N>. The second calibration resistance units 120 and 130 generates secondary calibration codes, pull-down calibration codes NCODE<0:N> using the primary calibration codes PCODE<0:N>.

The comparing unit 103 compares a voltage of the ZQ node and a reference voltage VREF to generate an up signal UP and a down signal DOWN. The voltage of the ZQ node is generated by connecting the first calibration resistance unit 110 and the external resistor 101 of generally 240Ω. Here, the external resistor 101 is connected to a ZQ pin that is an external chip surface of the ZQ node. The reference voltage is generated by an internal reference voltage generation unit 102, and is generally set to VDDQ/2.

The pull-up counter 105 receives the up/down signals to generate binary codes, the pull-up codes PCODE<0:N>. The generated binary codes, i.e., the pull-up calibration codes PCODE<0:N> are used for turning on/off resistors connected in parallel in the first calibration resistance unit 110 to control resistance of the first calibration resistance unit 110. The controlled resistance of the first calibration resistance unit 110 is reflected again in the ZQ node voltage, and then the above described operation is repeated. That is, the first calibration resistance unit 110 is calibrated such that a total resistance of the first calibration resistance unit 110 becomes identical to that of the external resistor 101 of generally 240Ω (pull-up calibration).

The binary codes, i.e., the pull-up calibration code PCODE<0:N> generated by the above described pull-up calibration are input to the pull-up calibration resistance unit 120 to determine the total resistance of the pull-up calibration resistance unit 120. Next, a pull-down calibration is performed in a similar manner to the pull-up calibration, using the comparing unit 104 and the pull-down counting unit 106. Through the pull-down calibration, a voltage of node A becomes identical to the reference voltage VREF, that is, a total resistance of the pull-down calibration resistance unit 130 becomes identical to the total resistance of the pull-up calibration resistance unit 120.

The binary codes, i.e., the pull-up calibration codes PCODE<0:N> and the pull-down calibration codes NCODE<0:N> resulting from the above described ZQ calibrations, including the pull-up and pull-down calibrations, are input to termination resistors, including pull-up and pull-down resistors, at input/output pads. Resultantly, a resistance of the ODT device, e.g., pull-up and pull-down termination resistances at a DQ pad in a memory device, is determined. For reference, the pull-up and pull-down resistors at the input/output pads have identical layouts to the pull-up and pull-down calibration resistance units 120 and 130 of the calibration circuit shown in FIG. 1.

Enabling the ZQ calibration, i.e., enabling the calibration circuit is determined by the operation control unit 107 and the counting unit 108. The operation control unit 107 receives input signals ZQC, RESETB and A<10> and outputs signals ZQINIT, ZQOPER, ZQCS to select the kind of ZQ calibrations to be performed. Different types of ZQ calibration have different calibration times. The counting unit 108 counts a clock CLK to enable the comparing units 103 and 104 for a predetermined duration for each kind of ZQ calibrations to perform the ZQ calibration.

FIG. 2 is a circuit diagram illustrating a method for determining a termination resistance of an output driver in a semiconductor memory device using the calibration codes PCODE<0:N> and NCODE<0:N> generated by the calibration circuit of FIG. 1.

The output driver serves to output data in the semiconductor memory device. Referring to FIG. 2, the output driver includes pull-up and pull-down pre-driver units 210 and 220, and pull-up and pull-down termination resistance units 230 and 240 for outputting data. Pull-up and pull-down termination resistance units 230 and 240 are supplied with drain and source voltages VDDQ and VSSQ respectively.

A simple operation of the output driver will be described below. The pull-up and pull-down pre-driver units 210 and 220 control the pull-up termination resistance units 230 and 240, respectively. To output a data of a logic high level, the pull-up termination resistance unit 230 is turned on so that a data pin DQ has a logic high state. To output a data of a logic low level, the pull-down termination resistance unit 240 is turned on so that the data pin DQ has a logic low state. That is, by performing pull-up termination or pull-down termination, logic high level data or a logic low level data can be output.

Here, the number of resistors to be turned on in the pull-up termination resistance units 230 and the pull-down resistance unit 240 is determined by the pull-up calibration codes PCODE<0:N> and the pull-down calibration codes NCODE<0:N>. That is, which of the pull-up termination resistance unit 230 and the pull-down termination resistance unit 240 is to be turned on is determined by the logic state of the output data. However, the resistors to be turned on in the termination resistance units 230 and 240 are selected by the calibration codes PCODE<0:N> and NCODE<0:N>.

For reference, target resistances of the pull-up termination resistance unit 230 and the pull-down termination resistance unit are not necessarily identical to the resistance of 240Ω of the calibration resistance units 110, 120 and 130 in FIG. 1. For example, the target resistances thereof may also be ½ or ¼ of 240Ω, i.e., 120Ω or 60Ω. Signals DQP_CTRL and DQN_CTRL input to the pre-driver units 210 and 220 represents a group of control signals.

FIG. 3 is a block diagram of a conventional ODT device for illustrating transfer of codes generated in the calibration circuit of FIG. 1 to the termination resistance circuit, i.e., the output driver shown in FIG. 2.

The calibration circuit 310 generates a pull-up calibration code PCODE<0:N> and a pull-down calibration code NCODE<0:N>. The calibration codes PCODE<0:N> and NCODE<0:N> are transferred to the termination resistance circuit, i.e., the output driver 320 through a metal line connecting the calibration circuit 310 and the output driver 320. Since the total number of the pull-up and pull-down calibration codes PCODE<0:N> and NCODE<0:N> is 2(N+1), 2(N+1) metal lines are required. The distance between the calibration circuit 310 near around the ZQ pad and the output driver 320 near around the DQ pad is extremely long relatively in the semiconductor memory device. Therefore, connecting such a long distance with 2(N+1) metal lines may extremely increase a chip size.

SUMMARY OF THE INVENTION

Embodiments of the present invention are directed to providing an ODT device that can reduce number of lines for transferring calibration codes to reduce a size of a chip including the ODT device.

In accordance with an aspect of the invention, there is provided a calibration circuit configured to generate calibration codes for determining a termination resistance, a counting circuit configured to generate counting codes increasing with time, a transferring circuit configured to sequentially transfer the calibration codes in response to the counting codes, a receiving circuit configured to sequentially receive the calibration codes from the transferring circuit in response to the counting codes and a termination resistance circuit configured to perform impedance matching using a resistance determined according to the calibration codes.

DESCRIPTION OF SPECIFIC EMBODIMENTS

Hereinafter, an on die termination (ODT) device and a semiconductor memory device including the same in accordance with the present invention will be described in detail with reference to the accompanying drawings.

Figure 4:
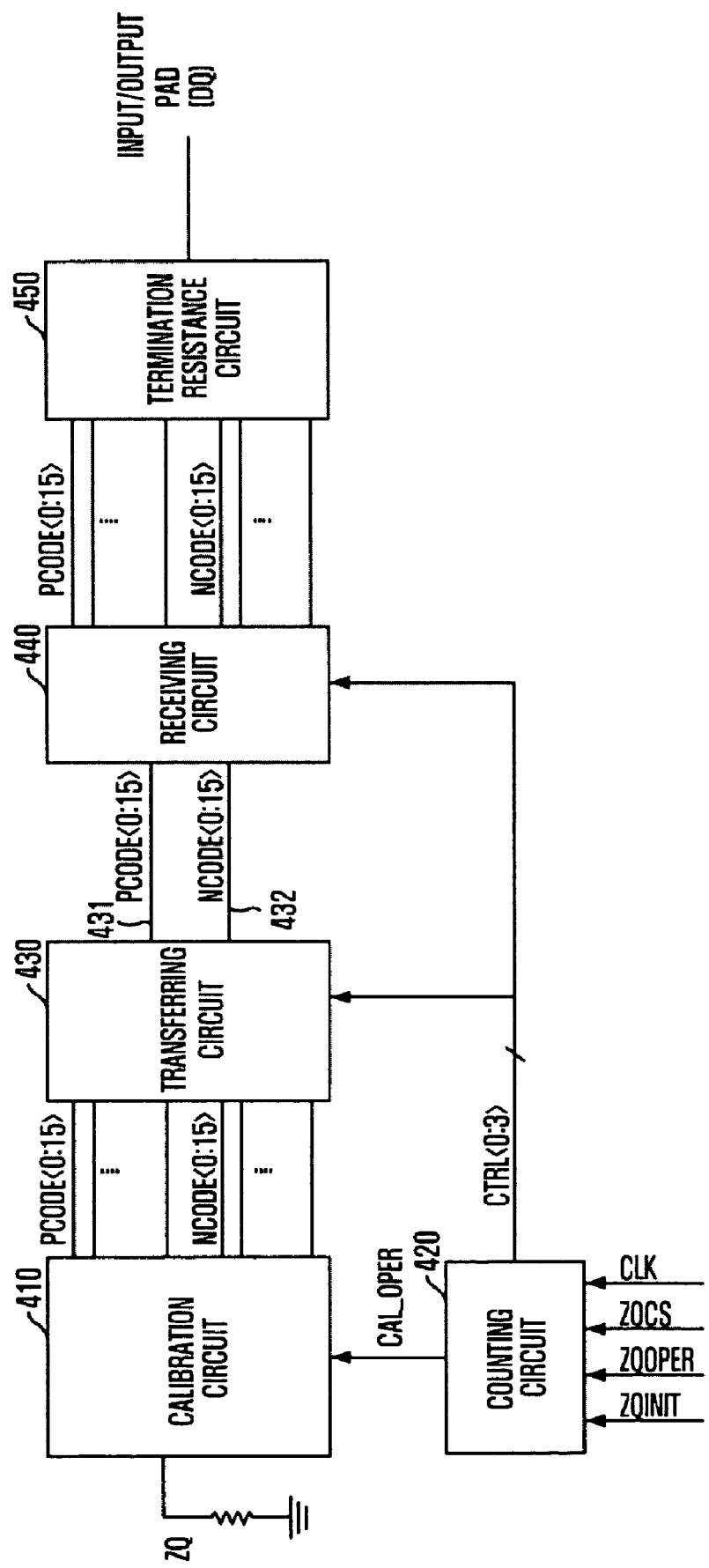
FIG. 4 is a block diagram of an ODT device in accordance with an embodiment of the present invention.

FIG. 4 is a block diagram of an ODT device in accordance with an embodiment of the invention.

Referring to FIG. 4, the ODT device includes a calibration circuit 410, a counting circuit 420, a transferring circuit 430, a receiving circuit 440, and a termination resistance circuit 450. The calibration circuit 410 generates calibration codes PCODE<0:15> and NCODE<0:15> for determining a termination resistance. The counting circuit 420 generates counting codes CTRL<0:3> increasing with time. The transferring circuit 430 sequentially transferring calibration codes PCODE<0:15> and NCODE<0:15> in response to the counting codes CTRL<0:3>. The receiving circuit 440 receives the calibration codes PCODE<0:15> and NCODE<0:15> from the transferring circuit 430 in response to the counting codes CTRL<0:3>. The termination resistance circuit 450 performs impedance matching using a resistance determined according to the calibration codes PCODE<0:15> and NCODE<0:15>.

The calibration circuit 410 generates the calibration codes PCODE<0:15> and NCODE<0:15> for determining the termination resistance. The calibration codes PCODE<0:15> and NCODE<0:15> includes pull-up calibration codes PCODE<0:15> for determining a pull-up termination resistance and pull-down calibration codes NCODE<0:15> for determining a pull-down termination resistance. The calibration codes may also include only the pull-up calibration codes PCODE<0:15> or the pull-down calibration codes NCODE<0:15> according to a system to which the ODT device is applied.

For example, when the termination resistance circuit 430 terminates input/output nodes only in a pull-dup direction, the calibration codes include only the pull-up calibration codes PCODE<0:15>. When the termination resistance circuit 430 terminates the input/output nodes only in a pull-down direction, the calibration codes include only the pull-down calibration codes NCODE<0:15>.

Figure 1:
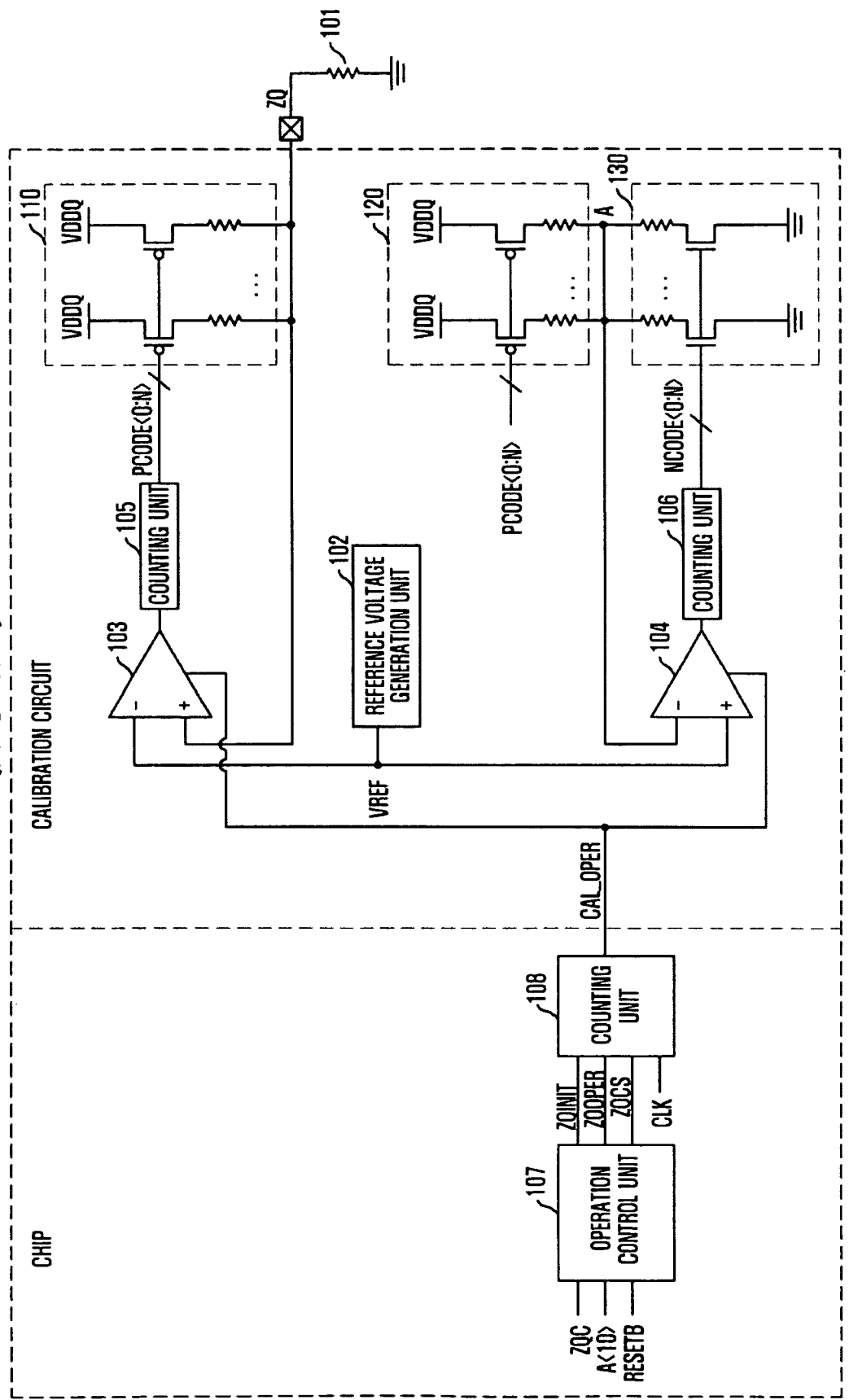
FIG. 1 is a circuit diagram of a conventional calibration circuit performing a ZQ calibration in an ODT device.

In a semiconductor memory device, an output driver serving as the termination resistance circuit 450 terminates the output node DQ in both pull-up and pull-down directions. Therefore, the calibration circuit 410 generates both the pull-up calibration codes PCODE<0:15> and the pull-down calibration codes NCODE<0:15>. Typical example of such calibration circuit is shown in FIG. 1. Since the embodiment is mainly about the transfer of the calibration codes PCODE<0:15> and NCODE<0:15>, not about the generation of the calibration codes PCODE<0:15> and NCODE<0:15>, a detailed description thereof will be omitted herein.

The counting circuit 420 generates counting codes CTRL<0:3> increasing with time. The counting codes CTRL<0:3> can be generated by counting clocks CLK. A conventional counting unit 108 in FIG. 1 used in a calibration circuit to count clocks to control an enable time can be used as the counting circuit 420. The calibration circuit 410 operates during up to 512 cycles (512 clocks) according to operation mode. Therefore, the counting circuit 420 is generally designed to count codes of up to 9 bits. The ODT device in accordance with the embodiment may use a portion of the counting codes. When the calibration codes PCODE<0:15> and NCODE<0:15> are 16-bit codes as shown in FIG. 4, the counting codes CTRL<0:3> may be 4-bit codes. That is, only the counting codes CTRL<0:3> may be used among the counting codes CTRL<0:8>.

FIG. 4 illustrates the case where the counting circuit 420 is identical to the counting unit 108 in FIG. 1. A signal CAL_OPER is a signal for controlling the enabling of the calibration circuit 410. The signal CAL_OPER is activated/deactivated based on the counting codes CTRL<0:8> which are generated by counting the clocks CLK.

The transferring circuit 430 sequentially transfers the calibration codes PCODE<0:15> and NCODE<0:15> to the receiving circuit 440 in response to the counting codes CTRL<0:3>. In the embodiment, the transferring circuit 430 and the receiving circuit 440 are connected by a first line 431 and a second line 432. The pull-up calibration codes PCODE<0:15> are sequentially transferred through the first line 431, and the pull-down calibration codes NCODE<0:15> are sequentially transferred through the second line 432. In more detail, the counting codes CTRL<0:3> correspond to specific codes of the pull-up and pull-down calibration codes PCODE<0:15> and NCODE<0:15>. That is, the pull-up and pull-down calibration codes PCODE<0:15> and NCODE<0:15> corresponding to the counting codes CTRL<0:3> are transferred through the first and second lines 431 and 432.

For example, PCODE<0> and NCODE<0> when the counting code set is (0, 0, 0, 0), PCODE<1> and NCODE<1> when the counting code set is (0, 0, 0, 1), PCODE<2> and NCODE<2> when the counting code set is (0, 0, 1, 0), . . . , and PCODE<15> and NCODE<15> when the counting code set is (1, 1, 1, 1) are transferred through the first and second lines 431 and 432, respectively.

In the embodiment, the transferring circuit 430 and the receiving circuit 440 are connected by the first and second lines 431 and 432 which transfers the pull-up and pull-down calibration codes PCODE<0:15> and NCODE<0:15>, respectively. However, the transferring circuit 430 and the receiving circuit 440 may also be connected by a single line. For example, when the counting codes are 5-bit codes CTRL<0:4>, the calibration codes PCODE<0:15> and NCODE<0:15> can be transferred through a single line. In this case, the line can be designed for transferring PCODE<1> when the counting code set is (0, 0, 0, 0, 0), PCODE<1> when the counting code set is (0, 0, 0, 0, 1), . . . , and NCODE<14> when the counting code set is (1, 1, 1, 1, 1). That is, according to the embodiment, the calibration codes PCODE<0:15> and NCODE<0:15> can be transferred from the transferring circuit 430 to the receiving circuit 440 through any number of lines according to a bit number of the counting codes CTRL<0:N>.

The receiving circuit 440 sequentially receives the calibration codes PCODE<0:15> and NCODE<0:15> from the transferring circuit 430 in response to the counting codes CTRL<0:3>. That is, the receiving circuit 440 sequentially receives the pull-up calibration codes PCODE<0:15> transferred through the first line 431 and the pull-down calibration codes NCODE<0:15> transferred through the second line 432 in response to the counting codes CTRL<0:4> to output them to respective paths. For example, when the counting codes CTRL<0:3> are (0, 0, 0, 0), the receiving circuit 440 receives a code transferred through the first line 431 as a calibration code PCODE<0> to output is to a path for the calibration code PCODE<0>, and receives a code transferred through the second line 432 as a calibration code NCODE<0> to output is to a path for the calibration code NCODE<0>. Similarly, when the counting codes CTRL<0:3> are (1, 1, 1, 1), the receiving circuit 440 receives a code transferred through the first line 431 as a calibration code PCODE<15> to output is to a path for the calibration code PCODE<15>, and receives a code transferred through the second line 432 as a calibration code NCODE<15> to output is to a path for the calibration code NCODE<15>.

In summary of the operations of the transferring circuit 430 and the receiving circuit 440, the transferring circuit 430 transfers the calibration codes PCODE<0:15> and NCODE<0:15> received through lines as many as the total number of the calibration codes PCODE<0:15> and NCODE<0:15> to the receiving circuit 440 through only two lines 431 and 432. Then, the receiving circuit 440 outputs the received calibration codes PCODE<0:15> and NCODE<0:15> to corresponding paths through lines as many as the total number of the calibration codes PCODE<0:15> and NCODE<0:15>.

Figure 2:
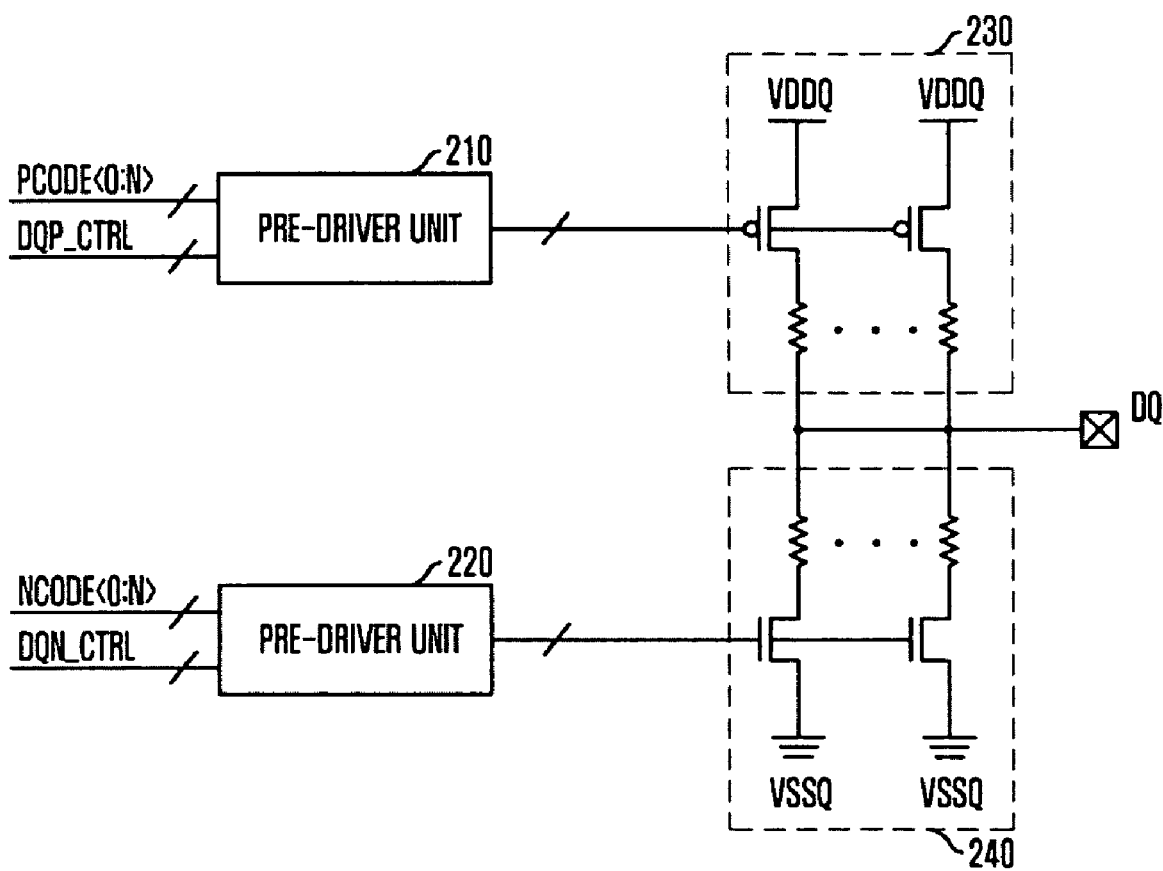
FIG. 2 is a circuit diagram illustrating a method for determining a termination resistance of an output driver in a semiconductor memory device using calibration codes PCODE<0:N> and NCODE<0:N> generated by the calibration circuit of FIG. 1.
Figure 3:
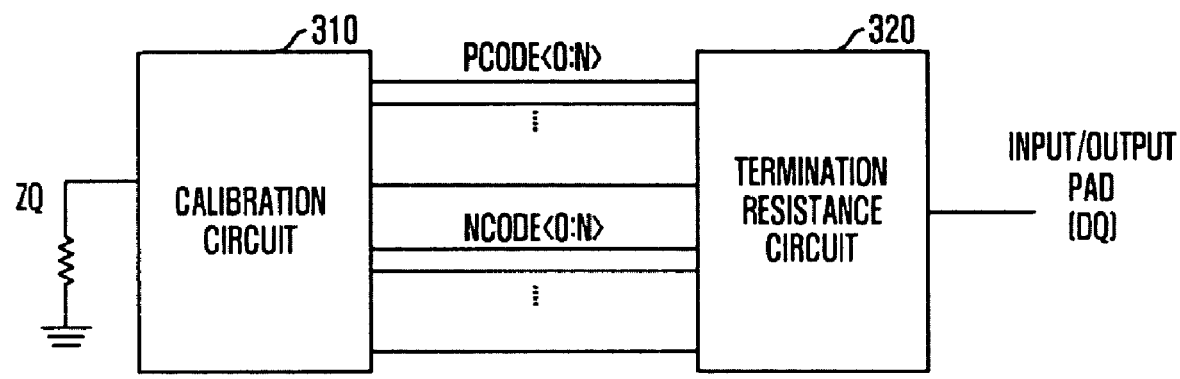
FIG. 3 is a block diagram of a conventional ODT device for illustrating transfer of codes generated in the calibration circuit of FIG. 1 to a termination resistance circuit, i.e., an output driver shown in FIG. 2.

The calibration resistance circuit 440 receives the calibration codes PCODE<0:15> and NCODE<0:15> from the receiving circuit 440 to perform impedance matching using the resistance determined by the calibration codes PCODE<0:15> and NCODE<0:15>. The output driver unit in FIG. 2 is a typical example of the calibration resistance circuit 440. The output driver of the semiconductor memory device terminates the data output node DQ in a pull-up or pull-down direction to output data.

A conventional ODT device requires 32 lines connecting the calibration circuit 410 and the termination resistance circuit 450 when 32 calibration codes PCODE<0:15> and NCODE<0:15> are used. However, the ODT device in accordance with the embodiment can transfer the calibration codes PCODE<0:15> and NCODE<0:15> through two lines or even through a single line. Though lines for transferring the counting codes CTRL<0:3> are required, even when the 4-bit counting codes are used as shown in FIG. 4, the number of lines for transferring the calibration codes PCODE<0:15> and NCODE<0:15> can be reduced to two.

That is, thirty two lines for transferring the calibration codes PCODE<0:15> and NCODE<0:15> in the conventional ODT device can be reduced to six lines including four lines for transferring the counting codes CTRL<0:3> and two lines for transferring the calibration codes PCODE<0:15> and NCODE<0:15>. By reducing the number of lines connecting the calibration circuit 410 and the termination resistance circuit 450, i.e., the output driver, size of the semiconductor chip to which the ODT device is applied can be reduced.

In the semiconductor memory device, since the calibration is performed during up to 512 cycles (clocks) at a time according to an operation mode, the counting circuit 420 is generally designed to count up to 9-bit counting codes CTRL<0:8>. Among them, 4-bit counting codes CTRL<0:3> are used in the embodiments. Therefore, while the counting circuit 420 counts the counting codes CTRL<0:8> during up to 512 cycles, the 4-bit counting codes CTRL<0:3> are repeated lots of times. This means that each of the identical calibration codes PCODE<0:15> and NCODE<0:15> are transferred lots of times from the calibration circuit 410 to the termination resistance circuit 450. Therefore, even if the calibration codes PCODE<0:15> and NCODE<0:15> are sequentially transferred through reduced number of lines, the calibration codes PCODE<0:15> and NCODE<0:15> can be transferred stably.

Figure 5:
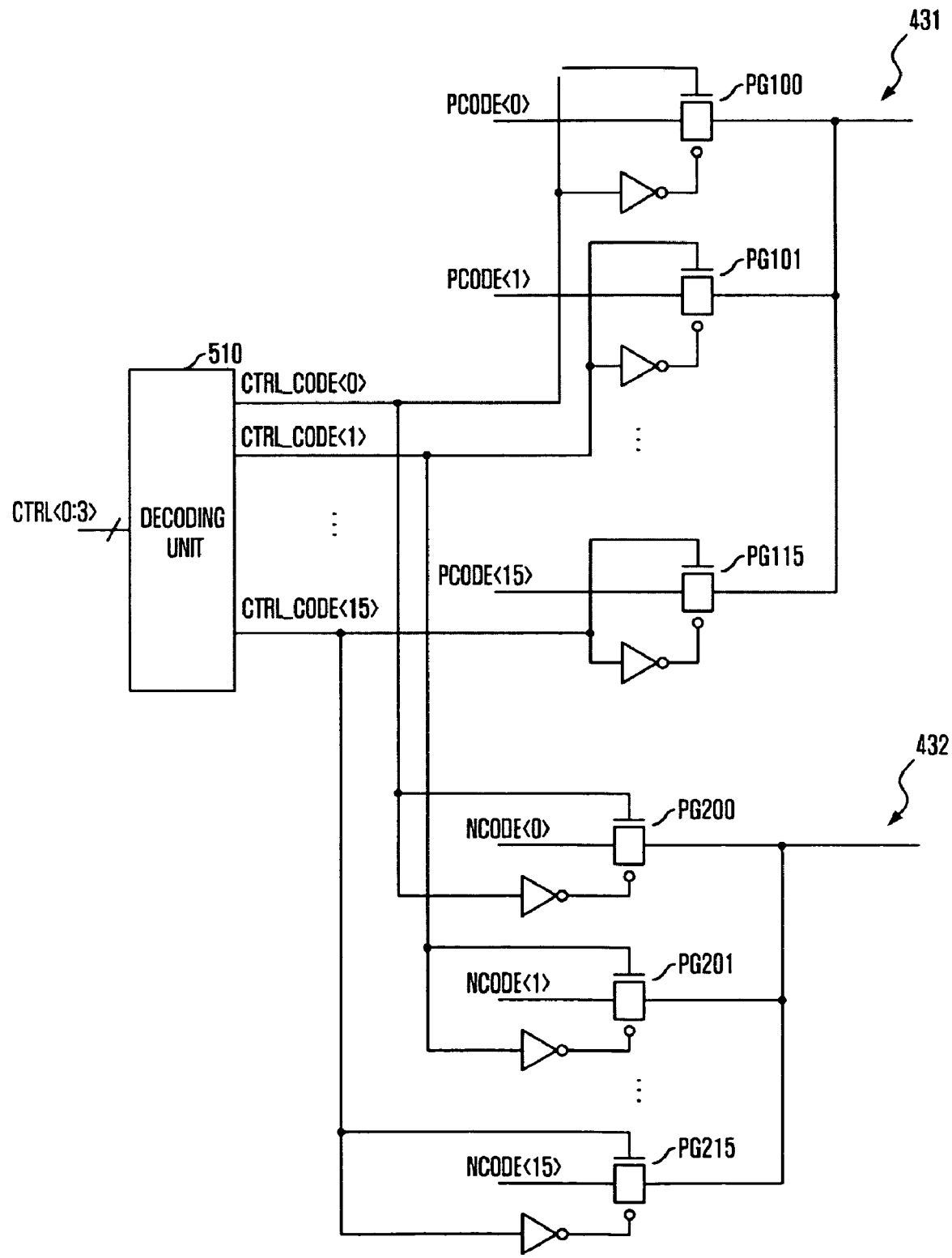
FIG. 5 is a circuit diagram of a transferring unit shown in FIG. 4.

FIG. 5 is a circuit diagram of the transferring unit shown in FIG. 4.

As described above, the transferring unit 430 sequentially transfers the calibration codes PCODE<0:15> and NCODE<0:15> generated by the calibration circuit 410 to the receiving circuit 440 in response to the counting codes CTRL<0:3>. The transferring circuit 430 includes first pass gates PG100 to PG115 and second pass gates PG200 to PG215. The first pass gates PG100 to PG115 receive the pull-up calibration codes PCODE<0:15> to output them to the first line 431. The second pass gates PG200 to PG215 receive the pull-down calibration codes NCODE<0:15> to output them to the second line 432. The first pass gates PG100 to PG115 and the second pass gates PG200 to PG215 are turned on/off according to the counting codes CTRL<0:3>.

Here, the first pass gates PG100 to PG115 and the second pass gates PG200 to PG215 do not receive the counting codes CTRL<0:3> directly. Instead, the first pass gates PG100 to PG115 and the second pass gates PG200 to PG215 are turned on/off by receiving control signals CTRL_CODE<0:15> that are decoded from the counting codes CTRL<0:3> by the decoding unit 510. The decoding unit 510 decodes the counting codes CTRL<0:3>, which are binary codes, to generate the control signals CTRL_CODE<0:15> for turning on/off the first and second pass gates PG100 to PG115 and PG200 to PG215. The control signals CTRL_CODE<0:15> decoded from the counting codes CTRL<0:3> are listed in Table 1.

TABLE 1

| Counting codes | Activated control signals |
| --- | --- |
| (0, 0, 0, 0) | CTRL_CODE<0> |
| (0, 0, 0, 1) | CTRL_CODE<1> |
| (0, 0, 1, 0) | CTRL_CODE<2> |
| (0, 0, 1, 1) | CTRL_CODE<3> |
| (0, 1, 0, 0) | CTRL_CODE<4> |
| (0, 1, 0, 1) | CTRL_CODE<5> |
| (0, 1, 1, 0) | CTRL_CODE<6> |
| (0, 1, 1, 1) | CTRL_CODE<7> |
| (1, 0, 0, 0) | CTRL_CODE<8> |
| (1, 0, 0, 1) | CTRL_CODE<9> |
| (1, 0, 1, 0) | CTRL_CODE<10> |
| (1, 0, 1, 1) | CTRL_CODE<11> |
| (1, 1, 0, 0) | CTRL_CODE<12> |
| (1, 1, 0, 1) | CTRL_CODE<13> |
| (1, 1, 1, 0) | CTRL_CODE<14> |
| (1, 1, 1, 1) | CTRL_CODE<15> |

That is, when the counting codes CTRL<0:3> are converted into a decimal code, the control signals CTRL_CODE<0:15> corresponding to respective numbers are activated.

As the counting codes CTRL<0:3> are changed, the control signals CTRL_CODE<0:15> are activated in sequence, thus turning on and off the first pass gates PG100 to PG115 and the second pass gates PG200 to PG215 sequentially. Resultantly, the pull-up calibration codes PCODE<0:N> and the pull-down calibration codes NCODE<0:N> are sequentially transferred through the first line 431 and the second line 432, respectively.

For example, when the counting code CTRL<0:3> is (0, 0, 0, 0), the pull-up and pull-down calibration codes PCODE<0> and NCODE<0> are transferred from the transferring circuit 440 to the second line 432 through the first and second lines 431 and 432, respectively. When the counting code CTRL<0:3> is (0, 0, 0, 1), the pull-up and pull-down calibration codes PCODE<1> and NCODE<1> are transferred from the transferring circuit 440 to the second line 432 through the first and second lines 431 and 432, respectively. When the counting code CTRL<0:3> is (1, 1, 1, 1), the pull-up and pull-down calibration codes PCODE<15> and NCODE<15> are transferred from the transferring circuit 440 to the second line 432 through the first and second lines 431 and 432, respectively.

Figure 6:
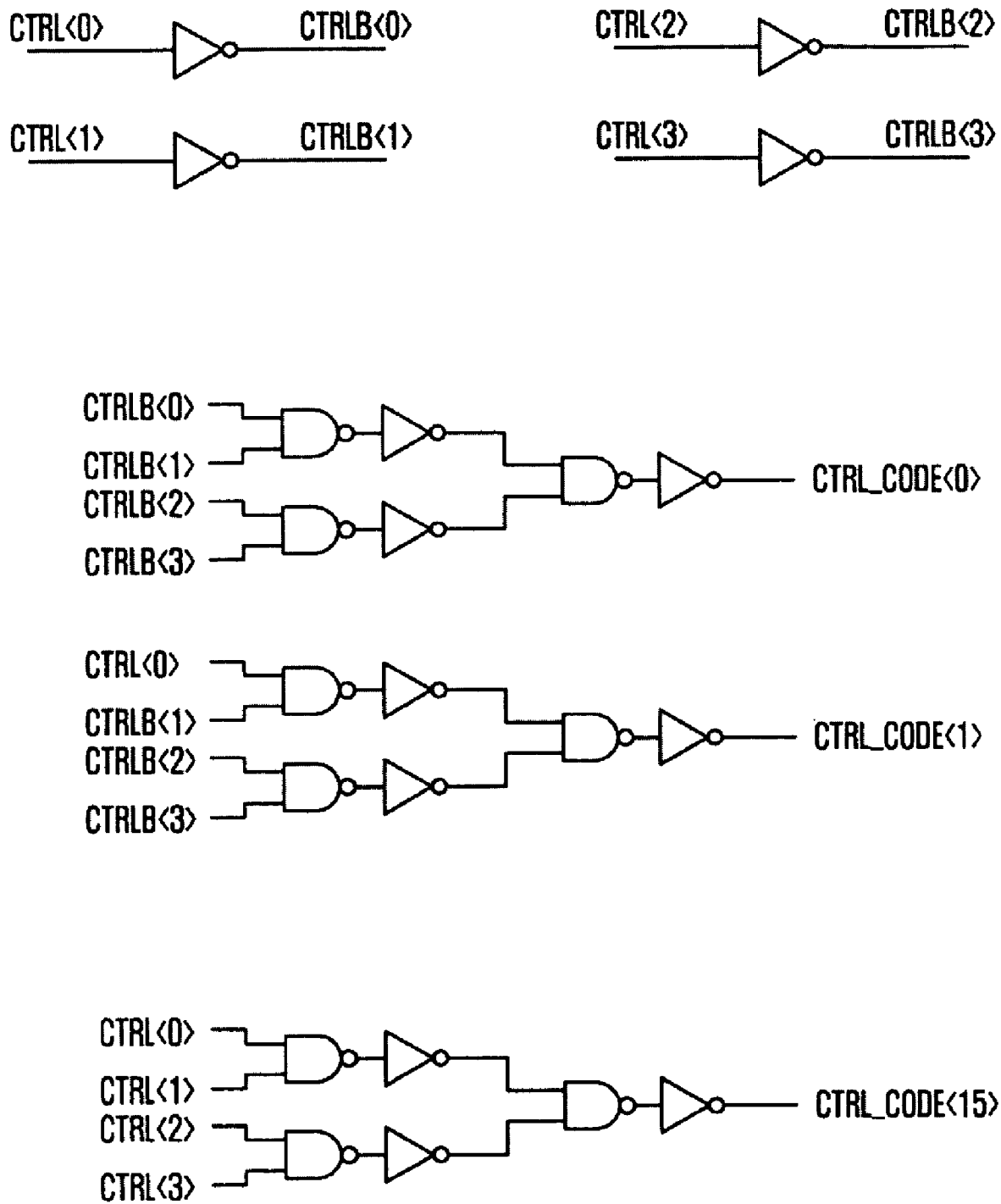
FIG. 6 is a circuit diagram of a decoding unit shown in FIG. 5.

FIG. 6 is a circuit diagram of the decoding unit 510 in FIG. 5.

Referring to FIG. 6, the decoding unit 510 may include a plurality of NOR gates and a plurality of inverters. The decoding unit 510 decodes the counting codes CTRL<0:3> to activate the control signals CTRL_CODE<0:15> corresponding to the binary counting codes CTRL<0:3> (see Table 1), with intermediate conversion to codes CTRLB<0:3>.

Besides the decoding unit 510 of this embodiment illustrated in FIG. 6, the decoding unit 510 may be modified in various forms, including a variety of logic gates and their combinations. Such a modification of the decoding unit 510 can be easily implemented and designed by a person having ordinary skill in the art, and thus further description will be omitted herein.

Figure 7:
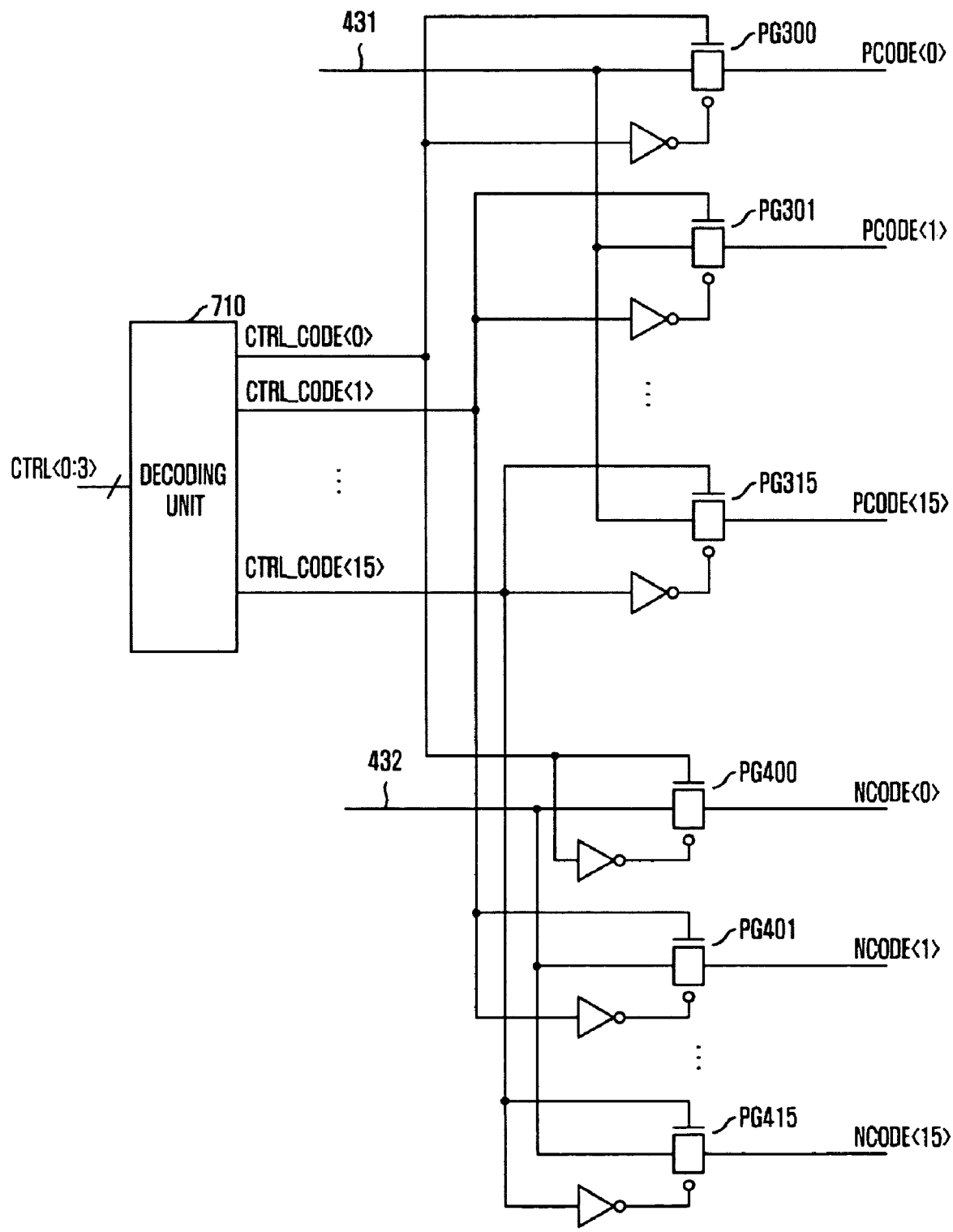
FIG. 7 is a circuit diagram of a receiving unit shown in FIG. 4.

FIG. 7 is a circuit diagram of the receiving circuit 440 in FIG. 4.

Referring to FIG. 7, the receiving circuit 440 sequentially receives the pull-up and pull-down calibration codes PCODE<0:15> and NCODE<0:15> received from the transferring circuit 430 to transfer them to the termination resistance circuit 450. The receiving circuit 440 includes third pass gates PG300 to PG315 configured to transfer the pull-up calibration codes PCODE<0:15> received from the first line 431 to corresponding paths, and fourth pass gates PG400 to PG415 configured to transfer the pull-down calibration codes NCODE<0:15> received from the second line 432 to corresponding path. The third pass gates PG300 to PG315 and the fourth pass gates PG400 to PG415 are turned on/off according to values of the counting codes CTRL<0:3>.

The third pass gates PG300 to PG315 and the fourth pass gates PG400 to PG415 are not turned on/off by directly receiving the counting codes CTRL<0:3>, but turned on/off by receiving the control signals CTRL_CODE<0:15> decoded from the counting codes CTRL<0:3> through a decoding unit 710. The decoding unit 710 of FIG. 7 is the same as the decoding unit (510 of FIG. 6) of the transferring circuit, and thus control signals CTRL_CODE<0:15> of the decoding unit 710 are also activated according to Table 1.

In summary, third pass gates PG300 to PG315 and the fourth pass gates PG400 to PG415 are sequentially turned on/off in the same manner as the first pass gates PG100 to PG115 and the second pass gates PG200 to PG215. The pull-up and pull-down calibration codes PCODE<0:15> and NCODE<0:15> received through the first and second lines 431 and 432 are transferred to the termination resistance circuit 450 through thirty two lines, which reduces the number of lines from thirty two to two between the transferring circuit 430 adjacent to the calibration circuit and the receiving circuit 440 adjacent to the termination resistance circuit. Even if considering an increase of four lines for transferring the counting codes CTRL<0:3>, it is possible to notably reduce the number of lines between the transferring circuit 430 and the receiving circuit 440 when compared to the conventional semiconductor memory device, thus contributing to a reduction in an area of a semiconductor memory device required for the ODT circuit can be reduced.

As described above, the ODT device can transfer a plurality of calibration codes in each line, and thus can reduce the number of lines connecting the calibration circuit and the termination resistance circuit of the ODT device.

Therefore, a space required for the transfer lines can be reduced, and thus the total chip size can also be reduced.

While the invention has been described with respect to the specific embodiments, it will be apparent to those skilled in the art that various changes and modifications may be made without departing from the spirit and scope of the invention as defined in the following claims.

What is claimed is:

1. An on die termination device, comprising:
    a calibration circuit configured to generate calibration codes for determining a termination resistance;
    a counting circuit configured to count clock cycles and generate counting codes having code values increasing with time;
    a transferring circuit configured to receive the counting codes and sequentially transfer the calibration codes through one or more lines in response to the counting codes, wherein the total number of the one or more lines is determined based on a number of at least a part of the counting codes;
    a receiving circuit configured to receive the counting codes and sequentially receive the calibration codes from the transferring circuit in response to the counting codes; and
    a termination resistance circuit configured to perform an impedance matching using the termination resistance determined according to the calibration codes.

2. The on die termination device as recited in claim 1, wherein the transferring circuit is connected to the receiving circuit by the one or more lines, and the receiving circuit is configured to sequentially receives the calibration codes from the transferring circuit through the one or more lines.

3. The on die termination device as recited in claim 1, wherein the calibration codes include pull-up calibration codes for determining a pull-up resistance and pull-down calibration codes for determining a pull-down resistance;
    the transferring circuit is connected to the receiving circuit by a first line and a second line;
    the receiving circuit is configured to sequentially receives the pull-up calibration codes from the transferring circuit through the first line; and
    the receiving circuit is configured to sequentially receives the pull-down calibration codes from the transferring circuit through the second line.

4. The on die termination device as recited in claim 3, wherein the counting codes correspond to specific codes of the pull-up and pull-down calibration codes, and the pull-up and pull-down calibration codes corresponding to code values of the counting codes are transferred through the first line and the second line.

5. The on die termination device as recited in claim 4, wherein the transferring circuit includes a plurality of first pass gates configured to transfer the pull-up calibration codes to the first line and a plurality of second pass gates configured to transfer the pull-down calibration codes to the second line, the first and second pass gates configured to be turned on/off according to the code values of the counting codes.

6. The on die termination device as recited in claim 5, wherein the receiving circuit includes a plurality of third pass gates configured to transfer the pull-up calibration codes received from the first line to corresponding paths and a plurality of fourth pass gates configured to transfer the pull-down calibration codes received from the second line to corresponding paths, the third pass gates and the fourth pass gates configured to be turned on/off according to the code values of the counting codes.

7. The on die termination device as recited in claim 6, wherein the transferring circuit further includes a decoder configured to decode the counting codes represented with binary codes to generate a control signal to turn on/off the first pass gates and the second pass gates.

8. The on die termination device as recited in claim 7, wherein the receiving circuit further includes a decoder configured to decode the counting codes represented with binary codes to generate a control signal to turn on/off the first pass gates and the second pass gates.

9. The on die termination device as recited in claim 1, wherein the transferring circuit and the receiving circuit use all or a part of the counting codes.

10. The on die termination device as recited in claim 1, wherein the counting circuit is configured to counts a clock to generate the counting codes, to control an enable time of the calibration circuit according to a calibration operation mode.

11. A semiconductor memory device, comprising:
    a calibration circuit configured to generate pull-up calibration codes and pull-down calibration codes for determining a termination resistance;
    a counting circuit configured to count clock cycles and generate counting codes having code values increasing with time;
    a transferring circuit configured to receive the counting codes and sequentially transfer the pull-up calibration codes and the pull-down calibration codes through one or more lines in response to the counting codes, wherein the total number of the one or more lines is determined based on a number of at least a part of the counting codes;

a receiving circuit configured to receive the counting codes and sequentially receive the pull-up calibration codes and the pull-down calibration codes from the transferring circuit in response to the counting codes; and an output driver circuit configured to output data by pulling up or pulling down a data output node using the termination resistance determined by the pull-up calibration codes and the pull-down calibration codes received through the receiving circuit.

12. The semiconductor memory device as recited in claim 11, wherein the transferring circuit is connected to the receiving circuit by the one or more lines, and the receiving circuit is configured to sequentially receives the pull-up calibration codes and the pull-down calibration codes from the transferring circuit through the one or more lines.

13. The semiconductor memory device as recited in claim 11, wherein the transferring circuit is connected to the receiving circuit by a first line and a second line;

the receiving circuit is configured to sequentially receives the pull-up calibration codes from the transferring circuit through the first line; and the receiving circuit is configured to sequentially receives the pull-down calibration codes from the transferring circuit through the second line.

14. The semiconductor memory device as recited in claim 13, wherein the counting codes correspond to specific codes of the pull-up calibration codes and the pull-down calibration codes, and the pull-up and pull-down calibration codes corresponding to code values of the counting codes are transferred through the first line and the second line.

15. The semiconductor memory device as recited in claim 14, wherein the transferring circuit includes a plurality of first pass gates configured to transfer the pull-up calibration codes to the first line, and a plurality of second pass gates configured to transfer the pull-down calibration codes to the second line, the first and second pass gates configured to be turned on/off according to the code values of the counting codes.

16. The semiconductor memory device as recited in claim 15, wherein the receiving circuit includes a plurality of third pass gates configured to transfer the pull-up calibration codes received from the first line to corresponding paths, and a plurality of fourth pass gates configured to transfer the pull-down calibration codes received from the second line to corresponding paths, the third pass gates and the fourth pass gates configured to be turned on/off according to the code values of the counting codes.

17. The semiconductor memory device as recited in claim 16, wherein the transferring circuit further includes a decoder configured to decode the counting codes represented with binary codes to generate a control signal to turn on/off the first pass gates and the second pass gates.

18. The semiconductor memory device as recited in claim 17, wherein the receiving circuit further includes a decoder configured to decode the counting codes represented with binary codes to generate a control signal to turn on/off the first pass gates and the second pass gates.

19. The semiconductor memory device as recited in claim 11, wherein the transferring circuit and the receiving circuit use all or a part of the counting codes.

20. The semiconductor memory device as recited in claim 11, wherein the counting circuit is configured to counts a clock to generate the counting codes, to control an enable time of the calibration circuit according to a calibration operation mode.

* * * * *